(12) United States Patent
Aoki

(10) Patent No.: US 7,153,365 B2
(45) Date of Patent: Dec. 26, 2006

(54) TRAY FOR SUBSTRATE

(75) Inventor: Taiichiro Aoki, Kanagawa (JP)

(73) Assignee: Tokyo Ohka Kogyo Co., Ltd., Kanagawa (JP)

( * ) Notice: Subject to any disclaimer, the term of this patent is extended or adjusted under 35 U.S.C. 154(b) by 102 days.

(21) Appl. No.: 10/745,275

(22) Filed: Dec. 23, 2003

(65) Prior Publication Data

US 2004/0134830 A1 Jul. 15, 2004

(30) Foreign Application Priority Data

Dec. 27, 2002 (JP) .............................. 2002-380124

(51) Int. Cl.
*B05C 13/00* (2006.01)

(52) U.S. Cl. ...................... 118/500; 118/501

(58) Field of Classification Search ................ 118/500, 118/52, 302, 732, 501; 279/3; 206/564, 206/1.7, 1.8, 521.9, 521.8; 220/506, 608
See application file for complete search history.

(56) References Cited

U.S. PATENT DOCUMENTS

| | | | | |
|---|---|---|---|---|
| 4,024,835 A | * | 5/1977 | Scheu et al. | 118/52 |
| 4,418,639 A | * | 12/1983 | Wills et al. | 118/50 |
| 5,171,398 A | * | 12/1992 | Miyamoto | 156/552 |
| 5,454,871 A | * | 10/1995 | Liaw et al. | 118/300 |
| 5,707,051 A | * | 1/1998 | Tsuji | 269/21 |
| 6,495,205 B1 | * | 12/2002 | Gibson et al. | 427/240 |
| 6,844,921 B1 | * | 1/2005 | Komatsu | 355/72 |
| 2003/0118724 A1 | * | 6/2003 | Kim | 427/240 |

FOREIGN PATENT DOCUMENTS

| | | |
|---|---|---|
| JP | 3336897 | 8/2002 |
| JP | 2002-289675 | 10/2002 |
| JP | 2002-313888 | 10/2002 |
| JP | 2002-313891 | 10/2002 |

* cited by examiner

*Primary Examiner*—Brenda A. Lamb
(74) *Attorney, Agent, or Firm*—Carrier, Blackman & Associates, P.C.; William D. Blackman; Joseph P. Carrier

(57) ABSTRACT

A tray, used for transferring a substrate and conducting a coating process, includes a recessed portion to accommodate a substrate, the depth of the recessed portion being substantially the same as the thickness of the substrate, and a one-step-lower gutter which is provided on an outer periphery of said recessed portion or inside the outer periphery of said recessed portion. The tray may further comprise a plurality of attracting grooves which are provided concentrically in a surface of said recessed portion; attracting holes which are provided in each attracting groove, respective attracting passages by which said attracting holes are connected to a vacuum source, and a pre-dispensing area which is formed on the same surface as the recessed portion to receive a coating liquid from a nozzle

5 Claims, 3 Drawing Sheets

TRAY FOR SUBSTRATE

BACKGROUND OF THE INVENTION

1. Field of the Invention

The present invention relates to a tray used for forming a coating film such as a thick film having a thickness of 20 μm or more on a surface of a substrate such as a glass substrate, a semiconductor wafer, and the like.

2. Description of the Prior Art

Documents 1–4 disclose trays in which a recessed portion is formed to accommodate a substrate such as a glass substrate, a semiconductor wafer, and the like.

Document 1 discloses a tray which is used for forming a film on a surface of a semiconductor wafer by epitaxial growth and has a recessed portion of a greater depth than that of the semiconductor wafer in the central portion thereof.

Document 2 discloses a structure in which a stage for attracting and holding a semiconductor wafer has concentric attracting grooves on the surface thereof, attracting holes are provided in each attracting groove, and these holes are connected to an attracting passage which is bored in the stage. This structure is used at the time of inspecting a circuit and the like formed on a surface of a semiconductor wafer.

Document 3 discloses a tray which is used for forming a film on a surface of a semiconductor wafer by epitaxial growth also. This tray has a recessed portion in the central portion thereof to accommodate a semiconductor wafer, and this tray is mainly made of silicon carbide.

Document 4 discloses a tray for transferring a substrate. This tray has a recessed portion to accommodate a substrate, and an insulative material having flexibility is provided in the recessed portion.

Document 1: Japanese Patent 3336897
Document 2: Japanese Patent Application Publication 2002-289675
Document 3: Japanese Patent Application Publication 2002-313888
Document 4: Japanese Patent Application Publication 2002-313891

Recently, trials of forming a thick film on a surface of a substrate have been performed. For example, it is necessary to form a resist film having a thickness of around 20 μm so as to form a protruding electrode, which is referred to as a bump, having a height of around 20 μm on a surface of an IC pattern by applying integrated circuit forming technology.

In addition, wire bonding, which has conventionally been used for mounting an IC chip on a substrate, requires labor and time because it is necessary to connect metal wires one by one in wire bonding. Thus, instead of wire bonding, there is another way, in which a plurality of metal posts are provided on a chip, and the chip is mounted on a substrate via the posts. Since the metal posts have a height of around 100 μm, it is necessary to form a resist film having a thickness of around 100 μm so as to form metal posts by applying integrated circuit forming technology.

However, if a conventional tray is used in a coating process for forming such a thick film, it is impossible to solve the following problems which are unique to the coating process.

In a case where the tray of Document 1 or 3 is used in the coating process, a coating liquid which enters between the substrate and the recessed portion of the tray passes a narrow gap between the reverse surface of the substrate and the surface of the recessed portion by capillary action and reaches the whole reverse surface of the substrate (See FIG. 5). This coating liquid becomes particles after drying, and the particles undesirably attach to the surface of the substrate.

In a case where holes are provided as mentioned in Document 2, a coating liquid which reaches the reverse surface enters the holes and prevents the holes from functioning. In this regard, since the plural holes are connected to the single attracting passage in Document 2, once a coating liquid enters the attracting passage, attraction from all holes is interfered with.

In a case where a single hole is provided in the center of the recessed portion as mentioned in Document 4, the reliability of attraction is inferior to the case of Document 2.

Also, if a nozzle is used for supplying a coating liquid to a substrate, there is a tendency that the concentration of the coating liquid is too dense at first. Thus, conventionally, pre-dispensing has been conducted in advance of applying a coating to the substrate. However, if the distance between the pre-dispensing area and the applying area is great, the tip end of the nozzle dries and the effect of the pre-dispensing is deteriorated. Conventional trays cannot solve this problem.

SUMMARY OF THE INVENTION

According to a first aspect of the present invention, for the purpose of overcoming the problems mentioned above, there is provided a tray comprising a recessed portion to accommodate a substrate, the depth of the recessed portion being substantially the same as the thickness of the substrate, and a one-step-lower gutter which is provided on the outer periphery of the recessed portion or inside the outer periphery of the recessed portion.

By providing the gutter which is lower than the surface of the recessed portion by one step, it is possible to prevent a coating liquid from reaching the reverse surface of the substrate.

According to another aspect of the present invention, there is provided a tray comprising a recessed portion to accommodate a substrate, the depth of the recessed portion being substantially the same as the thickness of the substrate, a plurality of attracting grooves which are provided concentrically in the surface of the recessed portion, and attracting holes which are provided in each attracting groove, and respective attracting passages by which the attracting holes are connected to a vacuum source.

By connecting the attracting holes to the vacuum source by the respective attracting passages, even in a case where one of the attracting holes is clogged with a coating liquid, vacuum attraction can be conducted by using other holes and thereby the tray can effectively function.

According to another aspect of the present invention, there is provided a tray comprising a recessed portion formed on one side of one surface of the tray to accommodate a substrate and a pre-dispensing area formed on the other side of the same surface to receive a coating liquid from a nozzle.

By forming the recessed portion and the pre-dispensing area on the same surface of the tray, it is possible to supply a coating liquid to the substrate continuously with pre-dispensing or in a substantially continuous state with pre-dispensing, and thereby uniform application of a coating liquid can be achieved.

DETAILED DESCRIPTION OF THE PREFERRED EMBODIMENTS

Hereinafter, embodiments according to the present invention will be explained with reference to the attached drawings.

Figure 1:
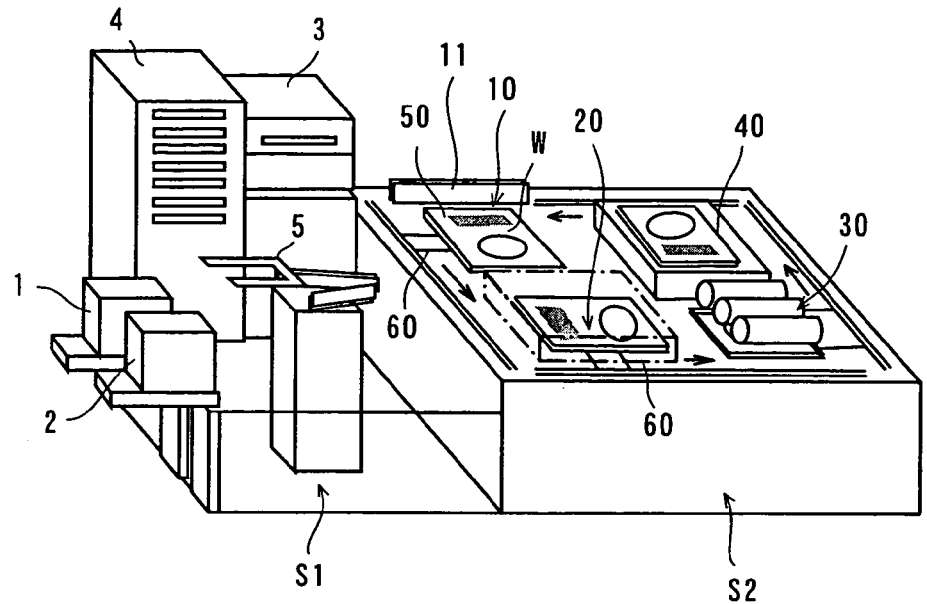
FIG. 1 is a perspective view showing the whole structure of a film forming apparatus to which a tray according to the present invention is applied.

As shown in FIG. 1, a film forming apparatus according to the present invention comprises a stock station for a substrate S1 and a treatment station S2 which are adjacent to each other. In the stock station S1, there are provided a cassette 1 for accommodating an untreated substrate, a cassette 2 for accommodating a treated substrate, an edge cleaning device 3, a drying device 4 and a handling device 5 for transferring, passing and receiving substrates.

The treatment station S2 is divided into four equal areas. A coating portion 10, a film-forming portion 20, a cleaning portion 30 and a drying portion 40 are correspondingly provided in the four areas. The treatment station S2 also comprises a transfer device 60 for feeding a tray 50 sequentially into the coating portion 10, the film-forming portion 20, the cleaning portion 30 and the drying portion 40 and drawing the tray 50 therefrom.

The tray 50 is circulated around the coating portion 10, the film-forming portion 20, the cleaning portion 30 and the drying portion 40 by the transfer device 60. In the drawing, the transfer device 60 is provided on the periphery of the treatment station S2. However, the transfer device 60 may be provided in the boundary between each portion or in the center of the treatment station S2. Also, the treatment station S2 may have two stages, and the coating portion 10, the film-forming portion 20, the cleaning portion 30 and the drying portion 40 may be provided in each stage.

Figure 2:
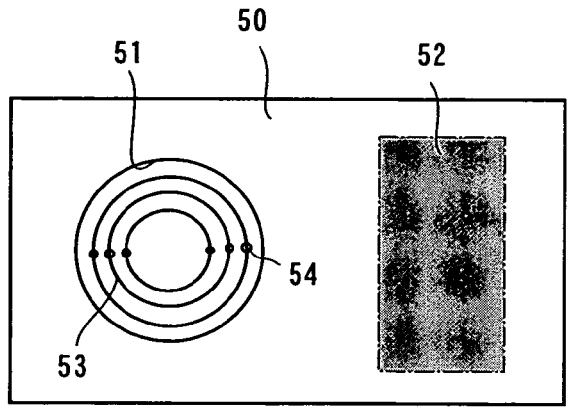
FIG. 2(a) is a plan view of a tray according to the present invention and FIG. 2(b) is a cross-sectional view of the same tray.
Figure 2:
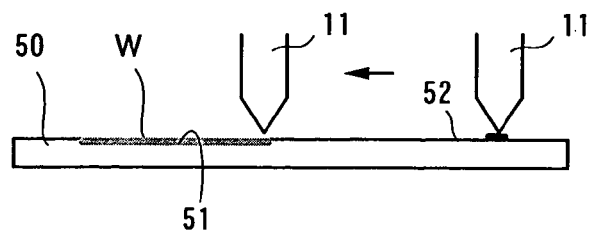

As shown in FIG. 2, the tray 50, which circulates around the coating portion 10, the film-forming portion 20, the cleaning portion 30 and the drying portion 40, has a flat and rectangular shape as a whole. A recessed portion 51 is formed on one side of one surface of the tray to accommodate a substrate, and a pre-dispensing area 52 is formed on the other side of the same surface to receive a coating liquid from a nozzle 11 in the coating portion 10. The recessed portion 51 is designed to have a slightly greater size than a substrate W (a semiconductor wafer in the embodiment) with respect to the plane view.

Figure 3:
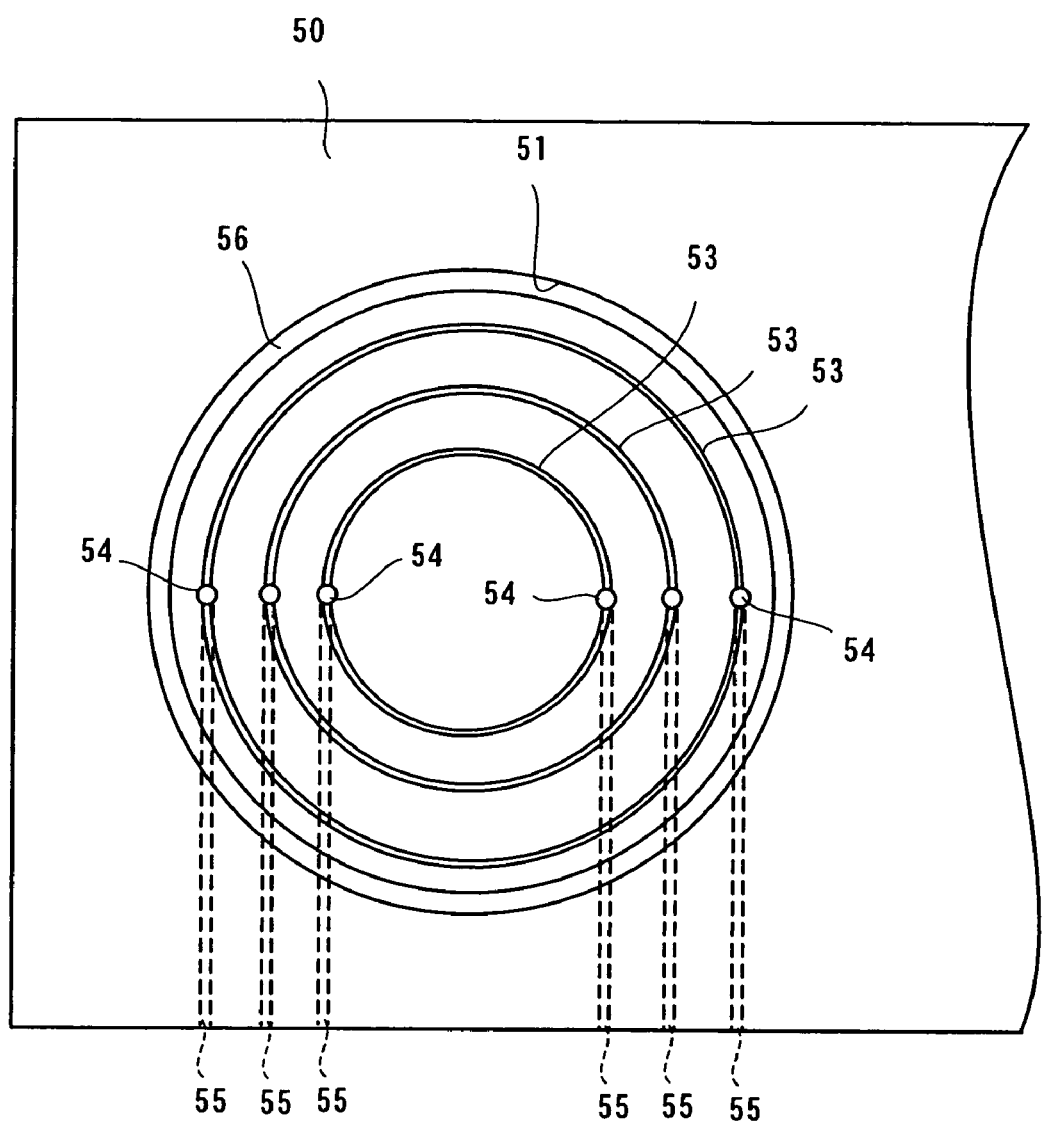
FIG. 3 is a plan view showing a recessed portion of a tray according to the present invention.

As shown in FIG. 3, attracting grooves 53 are concentrically formed on the surface of the recessed portion 51, attracting holes 54 are bored in each attracting groove, and these attracting holes 54 are connected to a pressure-reducing device such as a vacuum pump by respective attracting passages 55.

Figure 4:
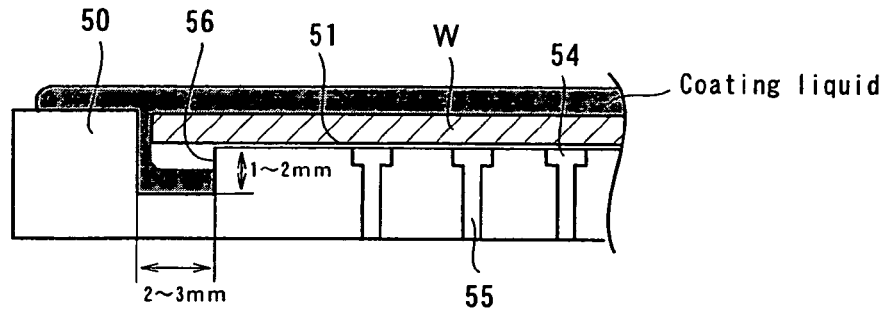
FIG. 4(a) is an enlarged cross-sectional view of the important section of a tray according to the present invention and FIG. 4(b) is an enlarged cross-sectional view of the important section of a tray according to another embodiment of the present invention.
Figure 4:
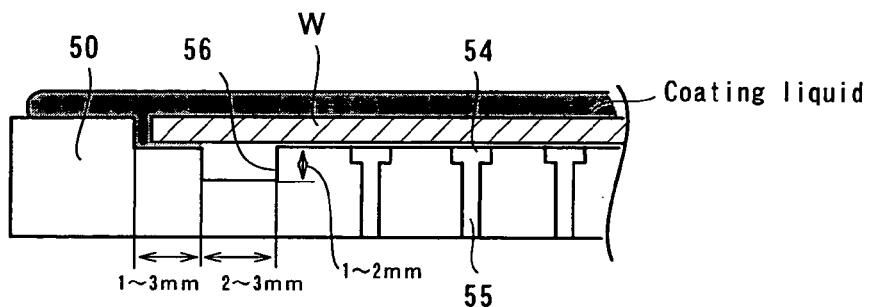
Figure 5:
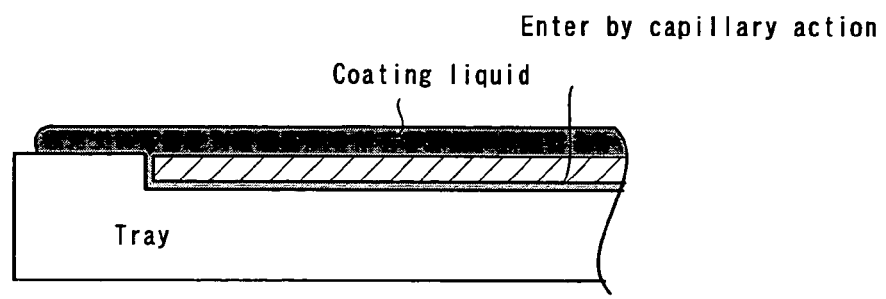
FIG. 5 is a view explaining the drawback of the related art.

Also, as shown in FIG. 4(a), the depth of the recessed portion 51 is equal to the thickness of the substrate W, so that the surface of the substrate W and the surface of the tray 50 are allowed to be in the same level at the time of coating. Also, a gutter 56 which is lower than the surface of the recessed portion by one step is provided on the outer periphery of the recessed portion 51. For example, the gutter 56 has a size of 2–3 mm in width and 1–2 mm in depth with respect to the surface of the recessed portion 51.

The gutter 56 may be provided inside the outer periphery of the recessed portion 51. For example, as shown in FIG. 4(b), the outer end of the gutter 56 is located 1–3 mm inside with respect to the outer periphery of the recessed portion 51. In this case, the gutter 56 has a size of 2–3 mm in width and 1–2 mm in depth with respect to the surface of the recessed portion 51 also.

In operation, a coating liquid which clogs the lower end of the slit nozzle 11 is drained to the pre-dispensing area 52, and thereafter the slit nozzle 11 is moved horizontally so as to supply a coating liquid onto the surface of the substrate W which is accommodated in the recessed portion 51 of the tray 50. In this instance, the coating liquid will enter between the substrate W and the recessed potion 51 to some extent due to capillary action. However, the coating liquid is blocked in the gutter 56 and prevented from entering further.

Next, the substrate W is released from the attracted state, and lifted up by using pins (not shown in the drawing) which penetrate the tray from the bottom. In this instance, it is preferable to blow gas from the attracting holes 54 so as to promote the release of the substrate from the tray 50.

The embodiment of the tray 50 shown in the drawing has all of the pre-dispensing area 52, the respective attracting passages 55, and the one-step-lower gutter 56. However, a tray having at least one of them is within the scope of the present invention.

As is explained in the above, according to the present invention, by providing the one-step-lower gutter in or around the outer periphery of the recessed portion, it is possible to reliably prevent a coating liquid from reaching the reverse surface of the substrate.

By connecting the attracting holes provided in each of the concentric attracting grooves to the vacuum source by the respective attracting passages, even in a case where one of the attracting holes is clogged with a coating liquid, vacuum attraction can be conducted by using other holes and thereby the wafer can be held by the tray.

By forming the pre-dispensing area as well as the recessed portion in the tray, it is possible to supply a coating liquid to the substrate continuously with pre-dispensing or in a substantially continuous state with pre-dispensing, and thereby uniform application of a coating liquid can be achieved.

Although there have been described what are the present embodiments of the invention, it will be understood that variations and modifications may be made thereto without departing from the spirit or essence of the invention.

What is claimed is:

1. A tray, used for transferring a substrate and a coating process, said tray comprising:
   a recessed portion to accommodate a substrate, said recessed portion having a surface disposed at a depth which is substantially the same as a thickness of the substrate;
   a plurality of attracting grooves which are provided concentrically in the surface of said recessed portion;
   a gutter which is one step lower than the surface of the recessed portion and which is provided on an outer periphery of said recessed portion or inside the outer periphery of said recessed portion;

attracting holes which are provided in each attracting groove; and respective attracting passages by which said attracting holes are connected to a vacuum source.

2. A tray as defined in claim 1, wherein:

said recessed portion is formed on one side of a first surface of said tray; and said tray further comprises a pre-dispensing area which is formed on the other side of said first surface of said tray, wherein said pre-dispensing area is adapted to receive a coating liquid from a nozzle.

3. A tray as defined in claim 2, wherein said nozzle is a slit nozzle and said pre-dispensing area is adapted to receive the coating liquid drained from said slit nozzle.

4. A tray as defined in claim 1, wherein said gutter is adapted to collect coating that enters between the recessed portion and the substrate.

5. A tray as defined in claim 1, wherein each said attracting passage separately connects a corresponding one of said attracting holes to said vacuum source.

* * * * *

UNITED STATES PATENT AND TRADEMARK OFFICE
CERTIFICATE OF CORRECTION

| | | |
|---|---|---|
| PATENT NO. | : 7,153,365 B2 | Page 1 of 1 |
| APPLICATION NO. | : 10/745275 | |
| DATED | : December 26, 2006 | |
| INVENTOR(S) | : Aoki | |

It is certified that error appears in the above-identified patent and that said Letters Patent is hereby corrected as shown below:

<u>Column 4</u>:
      Line 58, change "a substrate and a coating" to --a substrate in a coating--.

Signed and Sealed this

Third Day of April, 2007

JON W. DUDAS
*Director of the United States Patent and Trademark Office*